US007027787B2

(12) United States Patent
Hirata

(10) Patent No.: US 7,027,787 B2
(45) Date of Patent: Apr. 11, 2006

(54) AUTOMATIC FREQUENCY CONTROL SYSTEM, OPERATION CONTROL METHOD THEREOF AND MOBILE COMMUNICATION DEVICE USING THE SAME

(75) Inventor: Masaru Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 407 days.

(21) Appl. No.: 10/633,717

(22) Filed: Aug. 5, 2003

(65) Prior Publication Data
US 2004/0038659 A1 Feb. 26, 2004

(30) Foreign Application Priority Data
Aug. 14, 2002 (JP) ............... 2002-236173

(51) Int. Cl.
*H04B 1/18* (2006.01)
(52) U.S. Cl. ............... 455/192.2; 455/182.1; 455/255; 455/192.1
(58) Field of Classification Search ............. 455/192.2, 455/192.1, 182.2, 196.1, 197.1, 226.1, 226.2, 455/226.3, 255, 265; 375/344
See application file for complete search history.

(56) References Cited

U.S. PATENT DOCUMENTS

| 3,007,044 | A | * | 10/1961 | Cookson .................... 455/265 |
| 5,115,515 | A | | 5/1992 | Yamamoto et al. |
| 5,179,729 | A | * | 1/1993 | Mishima et al. ............ 455/265 |
| 5,450,447 | A | * | 9/1995 | Dutta ..................... 455/182.2 |
| 5,940,748 | A | * | 8/1999 | Daughtry et al. ........ 455/192.2 |
| 5,974,098 | A | * | 10/1999 | Tsuda ........................ 455/257 |
| 6,278,867 | B1 | * | 8/2001 | Northcutt et al. ........... 455/255 |

FOREIGN PATENT DOCUMENTS

| CN | 1305281 A | 7/2001 |
| EP | 0 817 403 A3 | 7/1998 |
| JP | 61-73416 A | 4/1986 |

* cited by examiner

*Primary Examiner*—Lana Le
(74) *Attorney, Agent, or Firm*—Sughrue Mion, PLLC

(57) ABSTRACT

In a mobile communication device, communication can be resumed upon next communication without causing problem even when an AFC control signal becomes abnormal upon interruption of communication. Locked state and unlocked state of an AFC portion is monitored by an AFC monitoring portion 5. Upon interruption of communication, if in unlocked state, a TCXO 1 is controlled by the AFC portion using a TCXO control signal upon preceding locked state. By this, when communication failure is caused by influence of building, tunnel or the like or when communication is terminated, a reference frequency of the mobile communication device does not significantly offset from the reference frequency of a base station to facilitate communication upon next communication.

9 Claims, 8 Drawing Sheets

FLOWCHART OF OPERATION OF AFC STATE MONITORING PORTION

FLOWCHART OF NORMAL OPERATION OF AFC PORTION

FLOWCHART OF OPERATION OF CONVENTIONAL AFC PORTION

KNOWN SYMBOL PATTERN TRANSMITTED FROM BASE STATION

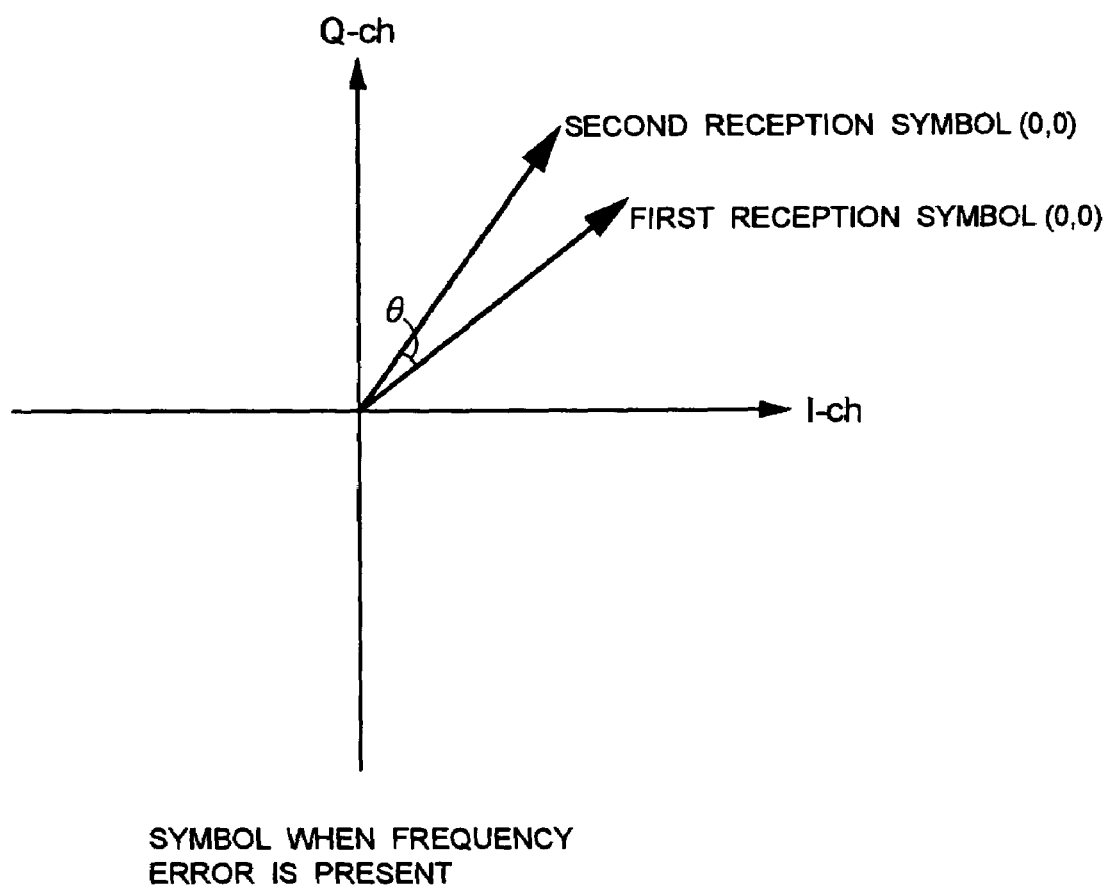

AUTOMATIC FREQUENCY CONTROL SYSTEM, OPERATION CONTROL METHOD THEREOF AND MOBILE COMMUNICATION DEVICE USING THE SAME

CROSS REFERENCE TO THE RELATED APPLICATION

The present application has been filed with claiming priority based on Japanese Patent Application No. 2002-236173, filed on Aug. 14, 2002. Disclosure of the above-identified Japanese Patent Application is here in incorporated by reference.

BACKGROUND OF THE INVENTION

1. Field of the Invention

The present invention relates to an automatic frequency control (AFC) system, an operation control method thereof and a mobile communication device using the same. More particularly, the invention relates to the AFC system for matching a reference frequency of a base station and a reference frequency of the mobile communication device in a mobile communication system.

2. Description of the Related Art

An example of the conventional AFC system of this kind is shown in FIG. 5. Referring to FIG. 5, TCXO (Temperature Compensated Crystal Oscillator) 1 is a voltage controlled oscillator generating a reference frequency of a mobile communication device. The reference frequency generated by the TCXO 1 is determined by a TCXO control signal fed from an AFC portion 2. A radio portion 3 uses a reference signal of the reference frequency output from the TCXO 1 to generate a local oscillation frequency by a not shown PLL (Phase Locked Loop) circuit to convert a carrier wave transmitted from the base station into a base band signal.

A digital signal processing portion 4 performs digital processing by using the base band signal from the radio portion 3. By demodulating the signal in a base band signal processing portion (demodulator) 41, communication is enabled. On the other hand, the digital signal processing portion 4 generates a frequency error information between the base station and the mobile communication device in a frequency error measuring portion 42 to feed to the AFC portion 2.

The AFC portion converts the frequency error information obtained by the digital signal processing portion 4 into a TCXO error signal in a TCXO error converting portion 21 and generates a TCXO control signal depending upon the TCXO error signal in a TCXO control portion 22 in order to match the reference frequency of the mobile communication device with the reference frequency of the base station. Since the reference frequency of the mobile communication device has to constantly match with the reference frequency of the base station, AFC control by the AFC portion has to be constantly active whenever the carrier wave is present.

FIG. 6 is a flowchart showing operation of the AFC portion 2, in which the reference frequencies of the mobile communication device and the base station are monitored (step S61). When a frequency error is smaller than a predetermined threshold value, it is regarded as AFC locked condition to stop updating of the TCXO control signal (steps S62 and S63). On the other hand, even in AFC locked condition, monitoring of frequency error is continued (step S61). When frequency error becomes greater than or equal to the threshold value, it is regarded as AFC unlocked condition to resume control for matching the reference frequency of the mobile communication device with the reference frequency of the base station (steps S62 and S64).

Here, an example of a frequency error measuring method in the frequency error measuring portion 42 of the AFC portion will be discussed. From the base station, a known symbol pattern is fed. Using this known symbol pattern, the frequency error of the mobile communication device is calculated. Referring to FIG. 7, there is shown an example of the known symbol pattern to be fed from the base station. When (0, 0) as a first symbol pattern is transmiited from the base station, and when the error is not present between the reference frequencies of the mobile communication device and the base station, the first symbol and a second symbol from the base station are demodulated as the same vector on an I-Q coordinates as shown in FIG. 8.

However, when the reference frequency of the mobile communication device is shifted to cause error, the first symbol and the second symbol become different vectors on the I-Q coordinates and an offset angle θ between the vectors corresponds to the frequency error as shown in FIG. 9. By converting the frequency error θ into a control voltage of the TCXO 1 and controlling the TCXO 1, θ=0 is established to match the reference frequencies of the mobile communication device and the base station. It should be noted that since the frequency error measuring system discussed with reference to FIGS. 7 to 9 is known in the mobile communication system, further detailed discussion will be eliminated.

In the conventional AFC portion 2 shown in FIG. 5, the reference frequency of the TCXO 1 is constantly controlled so that AFC operation is inherently performed even when communication of the carrier wave between the base station and the mobile communication device is interrupted due to influence of building, tunnel or the like and thus communication is stopped. Then, erroneous recognition of frequency error information is caused due to presence of noise component or the like to cause AFC unlocked condition and TCXO is controlled by the frequency error information again generated due to presence of noise component or the like to possibly cause significant shifting of the reference frequency of the mobile communication device.

When the reference frequency is significantly shifted, pull-in speed of AFC can become low or, communication with the base station can become impossible.

Here, reference is made to Japanese Unexamined Patent Publication No. Showa 61 (1986)-73416, in which is disclosed a technology for interrupting updating of AFC data when communication in the communication device is interrupted. When communication is interrupted, it is highly possible that AFC is already offset to possibly hold the offset. Interruption of communication is caused for bad condition of received wave. When AFC is performed with bad received wave, frequency offset can be caused.

SUMMARY OF THE INVENTION

The present invention has been worked out in view of the shortcoming in the prior art set forth above. It is therefore an object of the present invention to provide an AFC system which can enable communication without causing any problem in next communication by using a preceding normal AFC control signal even when the AFC control signal becomes abnormal upon interruption of communication, an operation control method thereof and a mobile communication device using the same.

According to the first aspect of the present invention, an automatic frequency control system comprises:

controlled oscillation means;

frequency converting means for generating a local oscillation frequency on the basis of a oscillation frequency of the controlled oscillation means and converting a reception signal including a reception reference frequency information into a base band signal on the basis of the local oscillation frequency;

automatic frequency control means for generating a frequency error information of the controlled oscillation means on the basis of the reception reference frequency information contained in the base band signal and controlling the controlled oscillation means by generating a control signal depending upon the frequency error information; and control means for performing control of an automatic frequency control operation by the automatic frequency control means using the control signal upon preceding automatic frequency control locked state responsive to interruption of communication.

The automatic frequency control means may generate a state information indicative of automatic frequency control locked state/unlocked state, when the state information indicates automatic frequency control unlocked state, a signal indicative of automatic frequency control unlocked state may be fed to the control means, and when the state information indicates automatic frequency control locked state, a signal indicative of automatic frequency locked state and the control signal thereat may be fed to the control means.

When the state information indicates automatic frequency control unlocked state upon interruption of communication, the control means may feed the control signal upon preceding automatic frequency control locked state to the automatic frequency control means.

According to the second aspect of the present invention, a mobile communication device may employ an automatic frequency control system of the first aspect of the invention.

The reception reference frequency information may be information indicative of a reference frequency of a base station.

According to the third aspect of the present invention, an operation control method for an automatic frequency control system including:

controlled oscillation means;

frequency converting means for generating a local oscillation frequency on the basis of a oscillation frequency of the controlled oscillation means and converting a reception signal including a reception reference frequency information into a base band signal on the basis of the local oscillation frequency;

automatic frequency control means for generating a frequency error information of the controlled oscillation means on the basis of the reception reference frequency information contained in the base band signal and controlling the controlled oscillation means by generating a control signal depending upon the frequency error information, the operation control method comprises the step of:

control step activated in response to interruption of communication, of performing control of an automatic frequency control operation by the automatic frequency control means using the control signal upon preceding automatic frequency control locked state.

According to the fourth aspect of the present invention, a storage medium storing a program for making a computer to execute an operation control for an automatic frequency control system including:

controlled oscillation means;

frequency converting means for generating a local oscillation frequency on the basis of a oscillation frequency of the controlled oscillation means and converting a reception signal including a reception reference frequency information into a base band signal on the basis of the local oscillation frequency;

automatic frequency control means for generating a frequency error information of the controlled oscillation means on the basis of the reception reference frequency information contained in the base band signal and controlling the controlled oscillation means by generating a control signal depending upon the frequency error information, the program comprises the step of, comprises:

control step activated in response to interruption of communication, of performing control of an automatic frequency control operation by the automatic frequency control means using the control signal upon preceding automatic frequency control locked state.

The program may further comprises a step of generating a state information indicative of automatic frequency control locked state/unlocked state in the automatic frequency control means, when the state information indicates automatic frequency control unlocked state, a signal indicative of automatic frequency control unlocked state is generated, and when the state information indicates automatic frequency control locked state, a signal indicative of automatic frequency locked state and the control signal thereat are generated, and the control step includes a step of feeding the control signal upon preceding automatic frequency control locked state to the automatic frequency control means when the state information indicates automatic frequency control unlocked state upon interruption of communication.

An operation of the invention will be dedcribed below. In the invention, the AFC portion is monitored. Upon interruption of communication, if in unlocked state, an AFC operation is controlled by using a control signal upon preceding automatic frequency control locked state. By this, when interruption of communication is caused by influence of building, tunnel or the like, a regerence frequency of the mobile communication device does not significantly offset from the reference frequency of the base station to facilitate communication upon next communication.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 9 is an illustration showing a demodulation symbol in the case where frequency error is present.

DESCRIPTION OF THE PREFERRED EMBODIMENT

The present invention will be discussed hereinafter in detail in terms of the preferred embodiment of an automatic frequency control (AFC) system, an operation control method thereof and a mobile communication device using the same according to the present invention with reference to the accompanying drawings. In the following description, numerous specific details are set forth in order to provide a thorough understanding of the present invention. It will be obvious, however, to those skilled in the art that the present invention may be practiced without these specific details.

Figure 1:
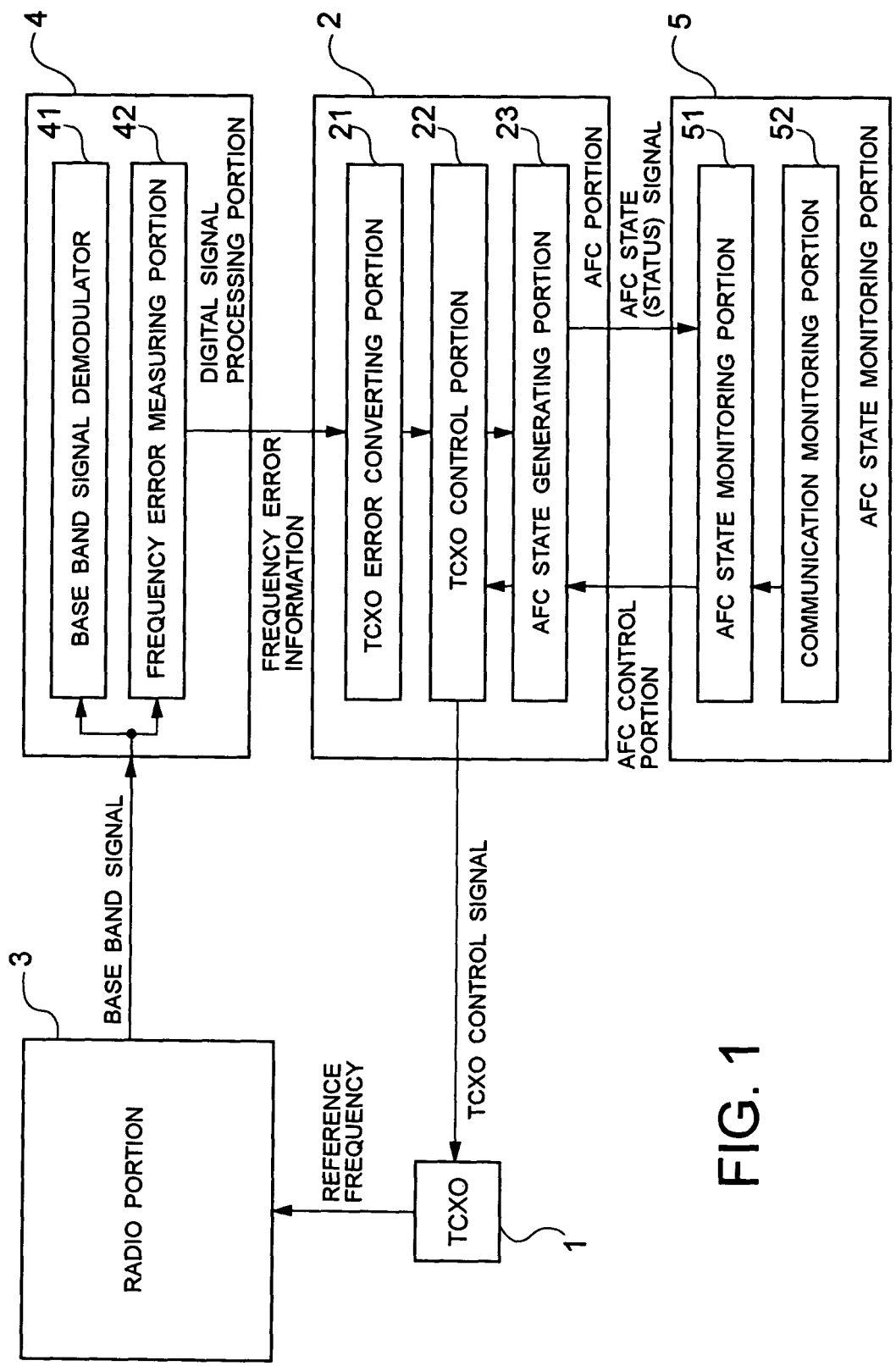
FIG. 1 is a block diagram of the preferred embodiment of an AFC system according to the present invention.
Figure 5:
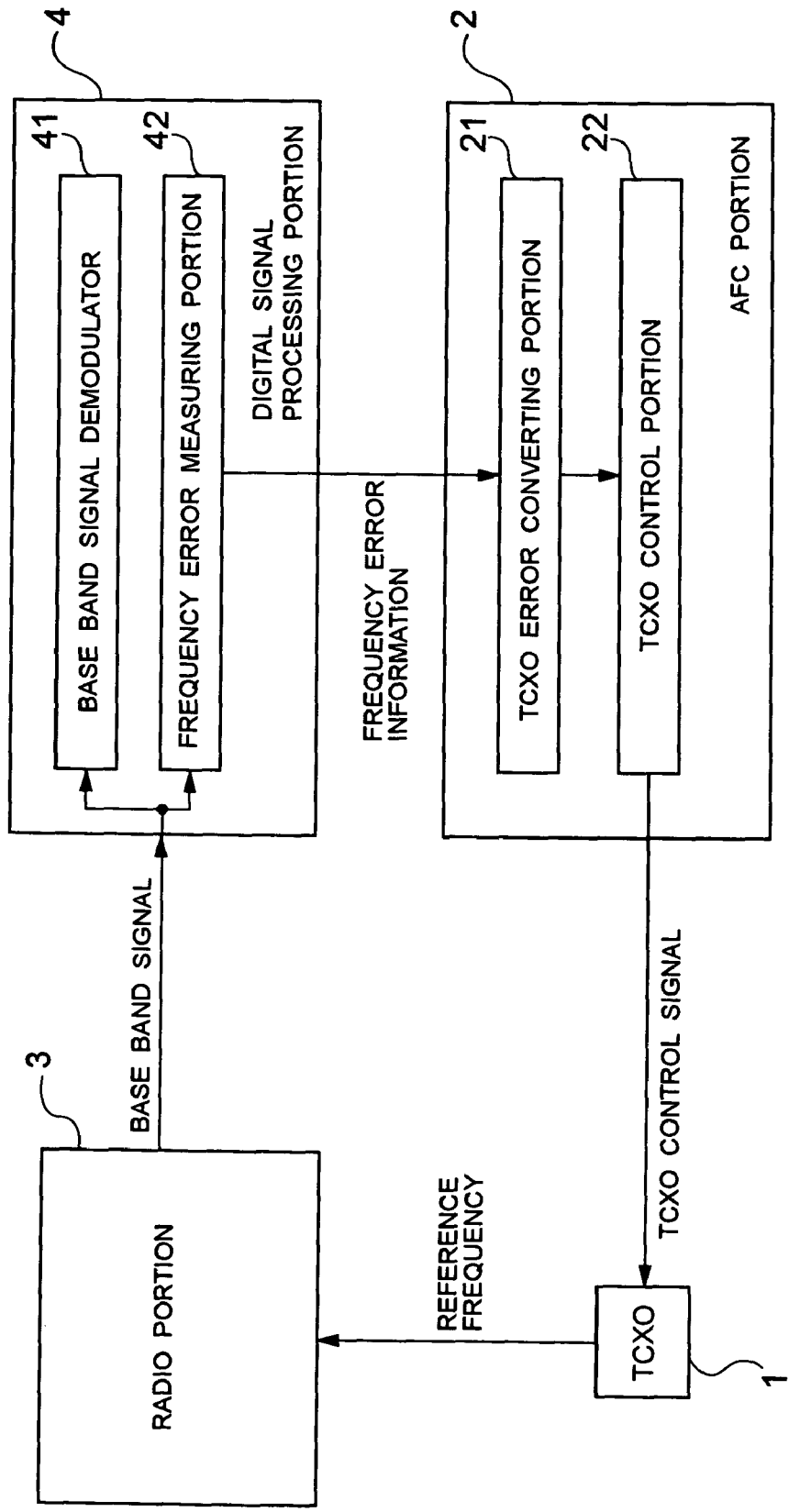
FIG. 5 is a block diagram showing the prior art.
Figure 6:
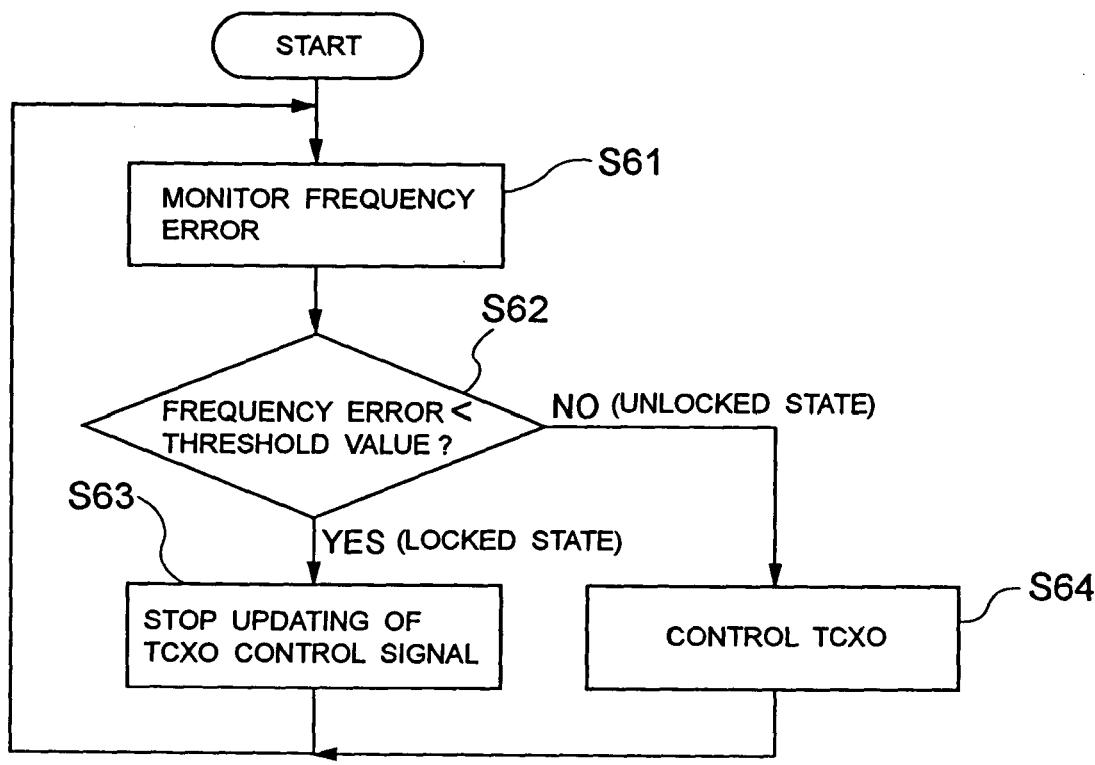
FIG. 6 is an operational flowchart of the AFC portion of FIG. 5.
Figure 7:
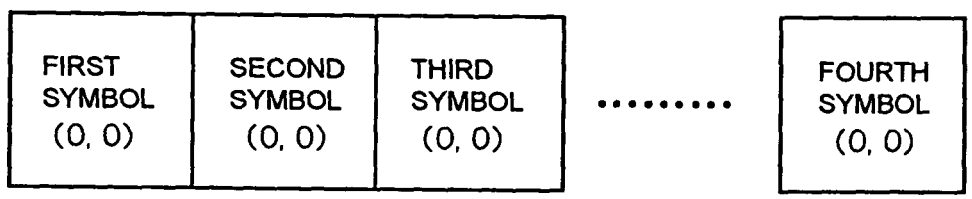
FIG. 7 is an illustration showing an example of a known symbol pattern transmitted from the base station.
Figure 8:
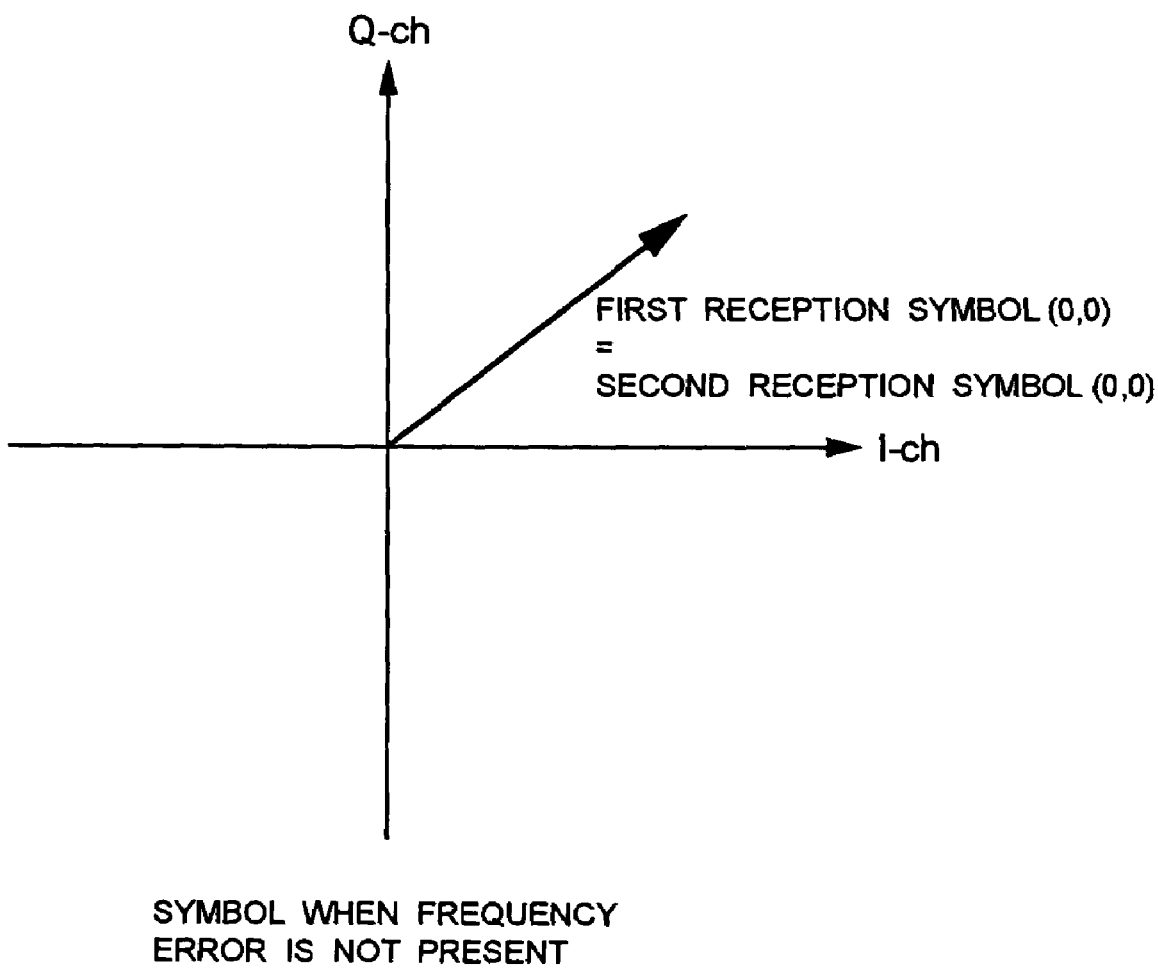
FIG. 8 is an illustration showing a demodulation symbol in the case where frequency error is not present.

FIG. 1 is a block diagram of the preferred embodiment of an AFC system according to the present invention, in which like components to those in FIG. 5 will be identified by like reference numerals and detailed discussion for the common components will be eliminated for avoiding redundant disclosure and whereby for keeping the disclosure simple enough to facilitate clear understanding of the invention. In the preferred embodiment shown in FIG. 1, an AFC state monitoring portion 5 is added for monitoring state of an AFC portion 2 in the prior art shown in FIG. 5. On the other hand, in the AFC portion, an AFC state generating portion 23 generating a state signal indicative of AFC state, namely AFC locked state/unlocked state, is provided.

The AFC state monitoring portion 5 has an AFC state monitoring portion 51 monitoring a state signal generated by the AFC state generating portion 23, and a communication monitoring portion 52 for monitoring interruption of communication. Other construction is similar to the prior art of FIG. 5.

Figure 2:
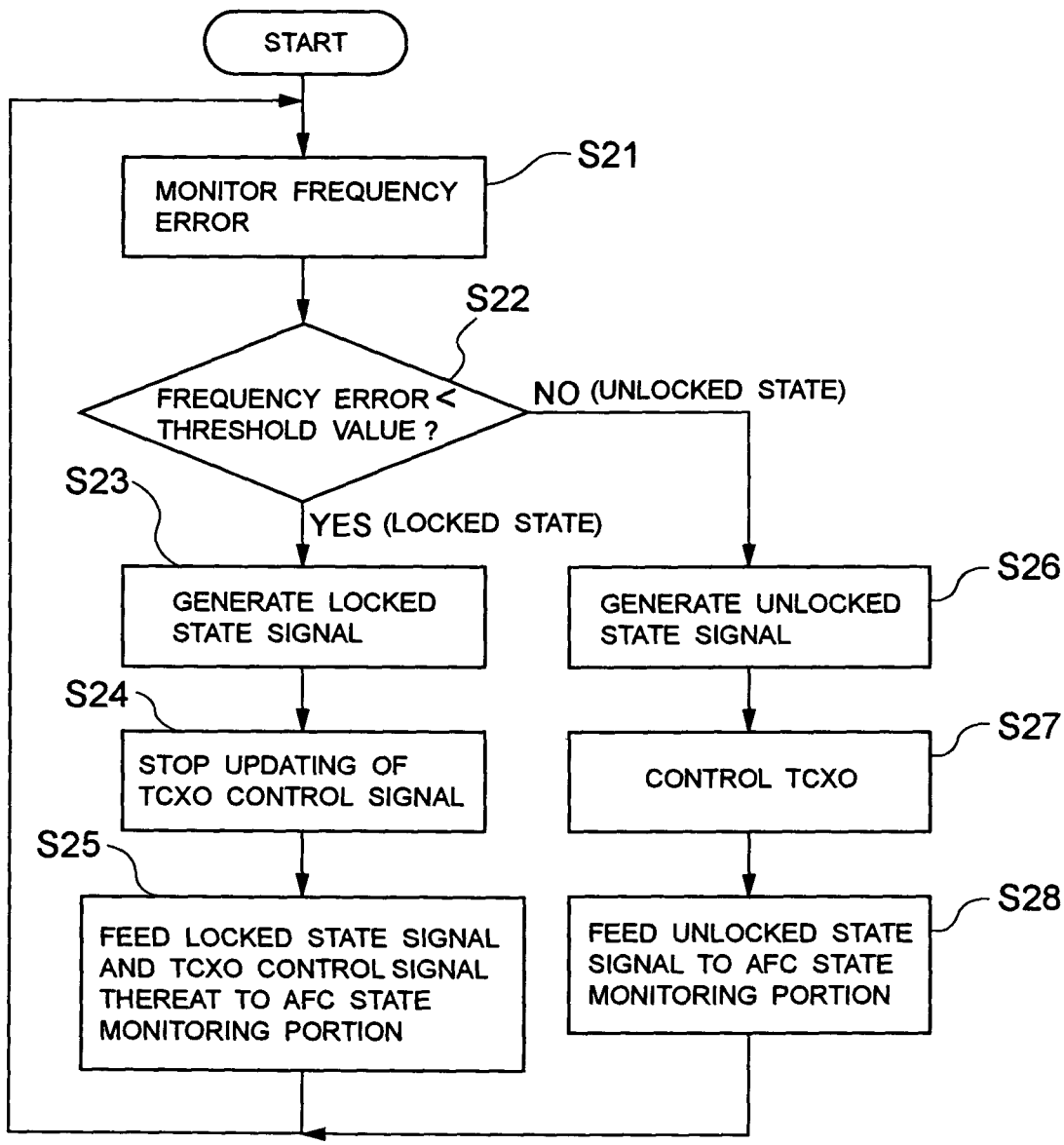
FIG. 2 is an operational flowchart in normal state of an AFC portion in FIG. 1.

FIG. 2 is an operational flowchart of normal operation of the AFC portion 2, in which an error of the reference frequencies of the mobile communication device and the base station is monitored (step S21). When a frequency error is smaller than a predetermined threshold value, it is regarded as AFC locked condition to generate a locked state signal (steps S22 and S23) and to stop updating of the TCXO control signal (step S24). Then, the locked state signal and the TCXO control signal at a corresponding timing are fed to the AFC state monitoring portion 5 (step S25).

Even in the AFC locked state, monitoring of frequency error is continued(step S21). When the frequency error becomes greater than or equal to threshold value, it is regarded as AFC unlocked (not locked) state to generate an unlocked condition signal (step S26) to control for matching with the reference signal of the mobile communication device by the TCXO control signal (step S27). At the same time, the unlock state signal is fed to the AFC state monitoring portion 5 (step S28). Then, process returns to step S21.

Figure 3:
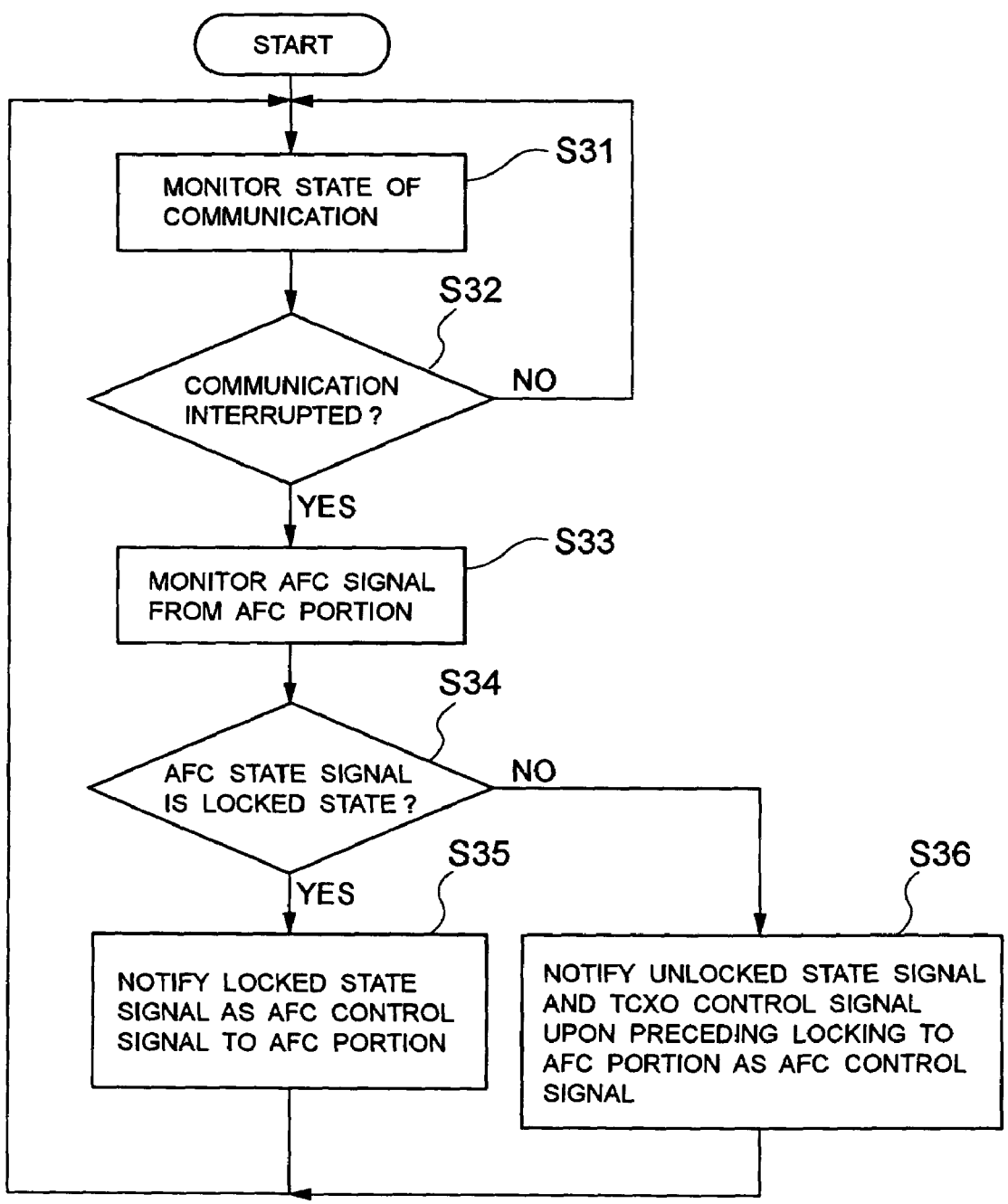
FIG. 3 is an operational flowchart of an AFC state monitoring portion of FIG. 1.

FIG. 3 is a flowchart showing operation of the AFC state monitoring portion 5. Referring to FIG. 3, communicating condition of the mobile communication device is monitored constantly (step S31). When communication is temporarily interrupted to stop due to building, tunnel or the like (step S32), a state signal from the AFC portion 2 is monitored (step S33) to perform the following operation. It should be noted that as a method of monitoring communicating condition in the communication monitoring portion 52, an SIR (signal to noise ratio) representative of reception quality of a downlink reception signal from the base station is monitored for making judgment that communication being interrupted when the SIR becomes smaller than or equal to the threshold value.

When communication is interrupted (operation of the AFC portion is stopped), the AFC state signal is monitored. If the AFC state signal is the locked state signal, the locked state signal is notified to the AFC portion 2 as the AFC control signal (step S35). If the AFC state signal is the unlocked state signal, the unlocked state signal and the TCXO control signal at preceding locking are notified to the AFC portion 2 as the AFC control signal (step S36).

Figure 4:
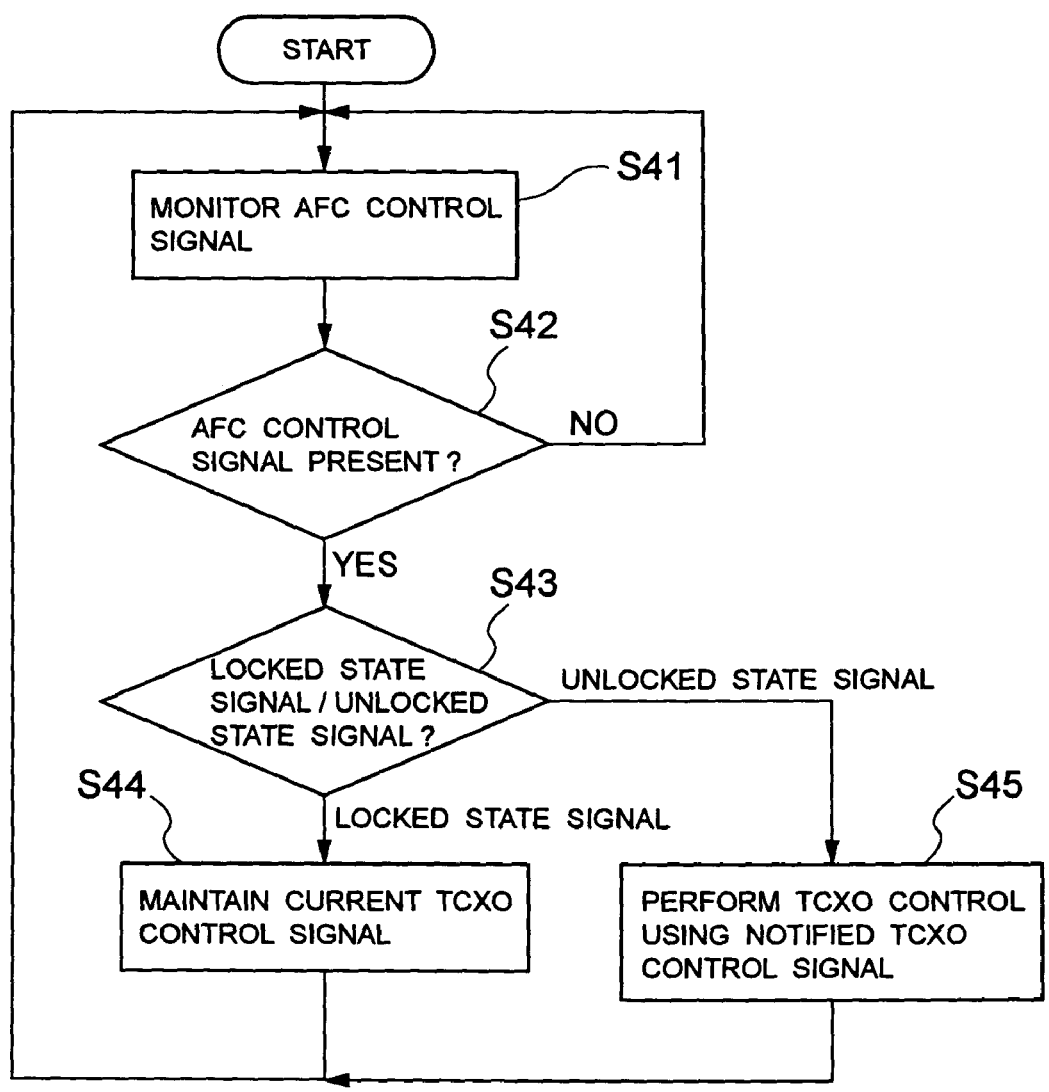
FIG. 4 is an operational flowchart of an AFC state monitoring portion upon interruption of communication.

FIG. 4 is a flowchart showing operation of the AFC portion 2 upon interruption of communication. Referring to FIG. 4, the AFC control signal notified from the AFC state monitoring portion 5 is monitored (step S41). If the AFC control signal is the locked state signal (step S42 and S43), the current TCXO control signal is maintained (step S44). When the notified AFC control signal is the unlocked state signal, TCXO control is performed using the TCXO control signal notified simultaneously (steps S43 and S45).

Namely, upon interruption of communication, if the AFC portion is in unlocked condition, the TCXO control signal at preceding locked state is notified to the AFC portion 2. Using the notified TCXO control signal, the AFC portion performs TCXO control. Accordingly, upon next communication (upon resumption of communication), the reference frequency of the mobile communication device is controlled to the value locked at once, the reference frequency of the mobile communication device is not significantly differentiated from the reference frequency of the base station to facilitate resumption of communication.

Obviously, the operation of the AFC state monitoring portion 5 set forth above may be preliminarily stored operation procedure in a storage medium, such as ROM or the like, as a program, and loaded to a computer, such as CPU or the like for execution.

As set forth above, with the present invention, the state of the AFC portion is monitored by providing the AFC state monitoring portion. When the state of the AFC portion is in unlocked state, the unlocked state signal and the TCXO control signal in the preceding locked state are notified to the AFC portion as the AFC control signal. Therefore, when communication failure of the carrier wave for communication with the base station is caused due to influence of the building, the tunnel or the like, or when communication is terminated, the base frequency of the mobile communication device may not be offset significantly to facilitate communication at next communication.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. An automatic frequency control system comprising:
   controlled oscillation means;
   frequency converting means for generating a local oscillation frequency on the basis of a oscillation frequency of said controlled oscillation means and converting a reception signal including a reception reference frequency information into a base band signal on the basis of said local oscillation frequency;

automatic frequency control means for generating a frequency error information of said controlled oscillation means on the basis of said reception reference frequency information contained in said base band signal and controlling said controlled oscillation means by generating a control signal depending upon said frequency error information; and control means for performing control of an automatic frequency control operation by said automatic frequency control means using said control signal upon preceding automatic frequency control locked state responsive to interruption of communication.

2. The automatic frequency control system as set forth in claim 1, wherein said automatic frequency control means generates a state information indicative of automatic frequency control locked state/unlocked state, when said state information indicates automatic frequency control unlocked state, a signal indicative of automatic frequency control unlocked state is fed to said control means, and when said state information indicates automatic frequency control locked state, a signal indicative of automatic frequency locked state and the control signal thereat are fed to said control means.

3. The automatic frequency control system as set forth in claim 1, wherein when said state information indicates automatic frequency control unlocked state upon interruption of communication, said control means feeds the control signal upon preceding automatic frequency control locked state to said automatic frequency control means.

4. A mobile communication device employing an automatic frequency control system as set forth in claim 1.

5. The mobile communication device as set forth in claim 4, wherein said reception reference frequency information is information indicative of a reference frequency of a base station.

6. An operation control method for an automatic frequency control system including:

controlled oscillation means;

frequency converting means for generating a local oscillation frequency on the basis of a oscillation frequency of said controlled oscillation means and converting a reception signal including a reception reference frequency information into a base band signal on the basis of said local oscillation frequency;

automatic frequency control means for generating a frequency error information of said controlled oscillation means on the basis of said reception reference frequency information contained in said base band signal and controlling said controlled oscillation means by generating a control signal depending upon said frequency error information, the operation control method comprising the step of:

control step activated in response to interruption of communication, of performing control of an automatic frequency control operation by said automatic frequency control means using said control signal upon preceding automatic frequency control locked state.

7. The operation control method as set forth in claim 6, which further comprises a step of generating a state information indicative of automatic frequency control locked state/unlocked state in said automatic frequency control means, when said state information indicates automatic frequency control unlocked state, a signal indicative of automatic frequency control unlocked state is generated, and when said state information indicates automatic frequency control locked state, a signal indicative of automatic frequency locked state and the control signal thereat are generated, and said control step includes a step of feeding the control signal upon preceding automatic frequency control locked state to said automatic frequency control means when said state information indicates automatic frequency control unlocked state upon interruption of communication.

8. A storage medium storing a program for making a computer to execute an operation control for an automatic frequency control system including:

controlled oscillation means;

frequency converting means for generating a local oscillation frequency on the basis of a oscillation frequency of said controlled oscillation means and converting a reception signal including a reception reference frequency information into a base band signal on the basis of said local oscillation frequency;

automatic frequency control means for generating a frequency error information of said controlled oscillation means on the basis of said reception reference frequency information contained in said base band signal and controlling said controlled oscillation means by generating a control signal depending upon said frequency error information, said program comprising the step of:

control step activated in response to interruption of communication, of performing control of an automatic frequency control operation by said automatic frequency control means using said control signal upon preceding automatic frequency control locked state.

9. The storage medium as set forth in claim 6, wherein said program further comprises a step of generating a state information indicative of automatic frequency control locked state/unlocked state in said automatic frequency control means, when said state information indicates automatic frequency control unlocked state, a signal indicative of automatic frequency control unlocked state is generated, and when said state information indicates automatic frequency control locked state, a signal indicative of automatic frequency locked state and the control signal thereat are generated, and said control step includes a step of feeding the control signal upon preceding automatic frequency control locked state to said automatic frequency control means when said state information indicates automatic frequency control unlocked state upon interruption of communication.

* * * * *